(12) United States Patent
Hsue et al.

(10) Patent No.: US 8,498,165 B2
(45) Date of Patent: Jul. 30, 2013

(54) DATA OUTPUTING METHOD OF MEMORY CIRCUIT AND MEMORY CIRCUIT AND LAYOUT THEREOF

(75) Inventors: Tzeng-Ju Hsue, Taoyuan County (TW); Chih-Hao Chen, Taipei County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 419 days.

(21) Appl. No.: 12/831,279

(22) Filed: Jul. 7, 2010

(65) Prior Publication Data

US 2012/0008421 A1   Jan. 12, 2012

(51) Int. Cl.
*G11C 7/10* (2006.01)

(52) U.S. Cl.
USPC ........................................ 365/189.05; 365/63

(58) Field of Classification Search
USPC ........ 365/189.011, 189.02, 220, 221, 189.05, 365/63; 710/305, 11
See application file for complete search history.

(56) References Cited

U.S. PATENT DOCUMENTS

| | | | |
|---|---|---|---|
| 7,613,049 B2 | 11/2009 | Hung et al. | |
| 2006/0067123 A1 | 3/2006 | Jigour et al. | |
| 2006/0268642 A1* | 11/2006 | Chen et al. | 365/220 |
| 2009/0196114 A1* | 8/2009 | Mine | 365/201 |
| 2010/0049948 A1* | 2/2010 | Jigour et al. | 712/208 |

* cited by examiner

*Primary Examiner* — Douglas King
(74) *Attorney, Agent, or Firm* — Jianq Chyun IP Office

(57) ABSTRACT

A data outputting method of a memory circuit is illustrated. The memory circuit having at least 16 data buffers DQ[0]~DQ[15] for storing at least 16 batches of data is provided. If a quadruple data outputting mode is selected for the memory circuit, when the clock signal triggers the 16 data buffers DQ[0]~DQ[15], the 4 batches of the data stored in the 4 data buffers DQ[0], DQ[1], DQ[8], DQ[9] via 4 input/output pins connected to the 4 data buffers DQ[0], DQ[1], DQ[8], DQ[9], the batch of data stored in the data buffer DQ[2n+2] is transferred to be stored in the data buffer DQ[2n], and the batch of the data stored in the data buffer DQ[2n+3] is transferred to be stored in the data buffer DQ[2n+1], for n is an integer from 0 through 2, and from 4 through 6.

5 Claims, 6 Drawing Sheets

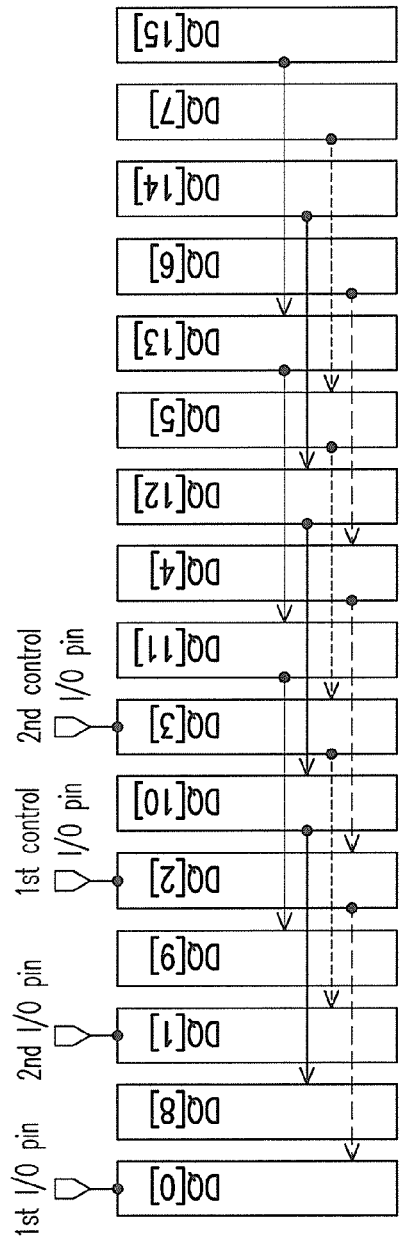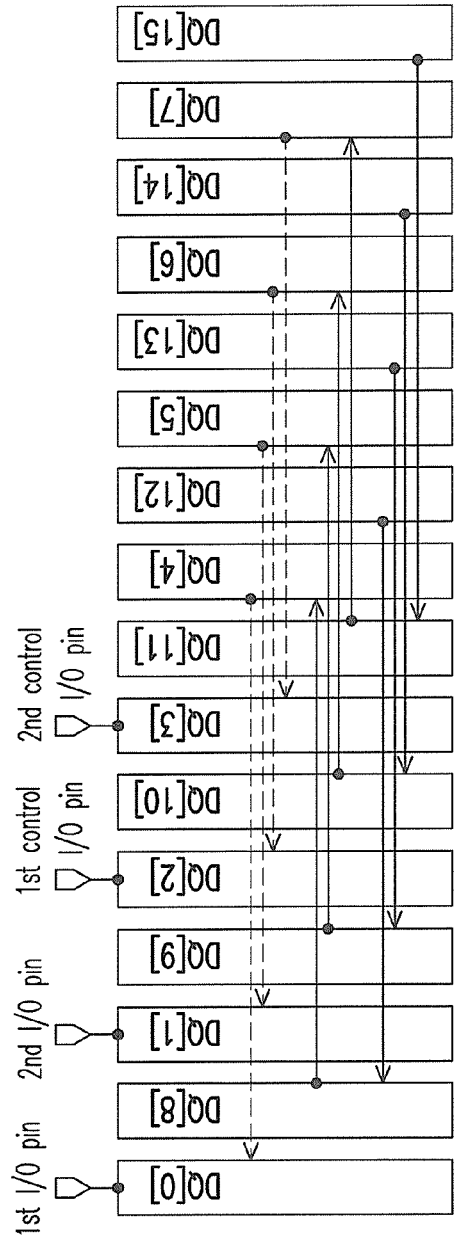
FIG. 2A (Related Art)
FIG. 2B (Related Art)

DATA OUTPUTING METHOD OF MEMORY CIRCUIT AND MEMORY CIRCUIT AND LAYOUT THEREOF

BACKGROUND

1. Technical Field

The present disclosure generally relates to a memory circuit, and more particularly to a data outputting method of a memory circuit, the memory circuit, and a layout of the memory circuit.

2. Description of Related Art

Flash memories are used in a variety of applications in electronics. These memory circuits often include a large number of input and output pins to accommodate data and addresses required to access the memory cells. In response to increasing space and wiring demands, serial flash memories have been developed to provide reduced pin counts, often requiring only one or two data pins. These serial flash memories provide a storage solution for systems with limited space, pin connections, and power supplies. Serial flash memories can be used for code download applications, as well as for storage of voice, video, text, and data, etc. However, conventional serial flash memory circuits have many limitations. For example, a conventional serial peripheral interface flash memory circuit transfers data or address bits in a sequential and serial fashion, increasing the design complexity and layout area of the memory circuit.

Referring to FIG. 1A, FIG. 1A is a wave diagram showing outputs of a serial peripheral interface memory circuit. The serial peripheral interface memory circuit is provided by U.S. Pat. No. 7,613,049, and a dual data outputting method is proposed and applied therein. The memory circuit includes a clock signal, a plurality of pins, and a configuration register. The configuration register includes a wait cycle count.

The dual data outputting method uses a first input/output pin SI/SIO0 and a second input/output pin SO/SIO1 to concurrently transmit a read address to the memory circuit, wherein the read address includes at least a first address bit and a second address bit, the first address bit is transmitted via the first input/output pin SI/SIO0, and the second address bit is transmitted via using the second input/output pin SO/SIO1. The first address bit for example is one of address bits A22, A20, ..., A2, and A0. The second address bit for example is one of address bits A23, A21, ..., A3, and A1.

The dual data outputting method accesses the memory circuit for data associated with the address and waiting a predetermined number clock cycles associated with the wait cycle count. The dual data outputting method transfers batches of data from the memory circuit by using the first input/output pin SI/SIO0 and the second input/output pin SO/SIO0 concurrently. To put it concretely, the first input/output pin SI/SIO0 sequentially outputs the 7 batches of the data D6, D4, D2, D0, D6, D4, D2 at the 7 falling edges of the $27^{th}$ through $33^{rd}$ clocks of the clock signal SCLK, and the second input/output pin SO/SIO1 sequentially outputs the 7 batches of the data D7, D5, D3, D1, D7, D5, D3 at the 7 falling edges of the $27^{th}$ through $33^{rd}$ clocks of the clock signal SCLK.

Referring to FIG. 1B, FIG. 1B is a wave diagram showing outputs of a serial peripheral interface memory circuit. The serial peripheral interface memory circuit is also provided by U.S. Pat. No. 7,613,049, and a quadruple data outputting method is proposed and applied therein. The memory circuit includes a clock signal, a plurality of pins, and a configuration register. The configuration register includes a wait cycle count. It is noted that the memory circuit herein is the same as the memory circuit corresponding to FIG. 1A, and either quadruple or dual data outputting method can be applied in the memory circuit.

The quadruple data outputting method uses a first input/output pin SI/SIO0, a second input/output pin SO/SIO1, a first control input/output pin WP#/SIO2, and a second control input/output pin HOLD#/SIO3 to concurrently transmit a read address to the memory circuit, wherein the read address includes at least a first address bit, a second address bit, at least a third address bit, and at least a fourth address bit. The first address bit is transmitted via the first input/output pin SI/SIO0, the second address bit is transmitted via using the second input/output pin SO/SIO1, the third address bit is transmitted via using the first control input/output pin WP#/SIO2, and the fourth address bit is transmitted via using the second control input/output pin HOLD#/SIO3. The first address bit for example is one of address bits A20, A16, ..., A4, and A0. The second address bit for example is one of address bits A21, A17, ..., A5, and A1. The third address bit for example is one of address bits A22, A18, ..., A6, and A2. The fourth address bit for example is one of address bits A23, A19, ..., A7, and A3.

The quadruple data outputting method accesses the memory circuit for data associated with the address and waiting a predetermined number clock cycles associated with the wait cycle count. The quadruple data outputting method transfers the batches of the data from the memory circuit by using the first input/output pin SI/SIO0, the second input/output pin SO/SIO1, the first control input/output pin WP#/SIO2, and the second control input/output pin HOLD#/SIO3 concurrently. To put it concretely, the first input/output pin SI/SIO0 sequentially outputs the 7 batches the data D4, D0, D4, D0, D4, D0, D4 at the 7 falling edges of the $21^{th}$ through $27^{th}$ clocks of the clock signal SCLK, the second input/output pin SO/SIO1 sequentially outputs the 7 batches of the data D5, D1, D5, D1, D5, D1, D5 at the 7 falling edges of the $21^{th}$ through $27^{th}$ clocks of the clock signal SCLK, the first control input/output pin WP#/SIO2 sequentially outputs the 7 batches of the data D6, D2, D6, D2, D6, D2, D6 at the 7 falling edges of the $21^{th}$ through $27^{th}$ clocks of the clock signal SCLK, and the second control input/output pin HOLD#/SIO3 sequentially outputs the 7 batches of the data D7, D3, D7, D3, D7, D3, D7 at the 7 falling edges of the $21^{th}$ through $27^{th}$ clocks of the clock signal SCLK.

Referring to FIG. 2A, FIG. 2A is a schematic diagram showing a layout of the memory circuit using the dual data outputting method. The memory circuit has 16 data buffers DQ[0]~DQ[15], and a first input/output pin, a second input/output pin, a first control input/output pin, and a second control input/output pin are respectively connected to data buffers DQ[0]~DQ[3], so as to output the 4 batches of the data stored in the data buffers DQ[0]~DQ[3].

A metal line is connected between the data buffers DQ[2k] and DQ[2k+2], so as to transfer the batch of the data stored in the data buffer DQ[2k+2] to be stored in the data buffer DQ[2k] when the data buffers DQ[2k] and DQ[2k+2] are triggered by the clock signal, wherein k is an integer from 0 through 2. Furthermore, a metal line is connected between the data buffers DQ[2k+1] and DQ[2k+3], so as to transfer the batch the data stored in the data buffer DQ[2k+3] to be stored in the data buffer DQ[2k+1] when the data buffers DQ[2k+1] and DQ[2k+3] are triggered by the clock signal. A metal line is connected between the data buffers DQ[2j] and DQ[2j+2], so as to transfer the batch of the data stored in the data buffer DQ[2j+2] to be stored in the data buffer DQ[2j] when the data buffers DQ[2j] and DQ[2j+2] are triggered by the clock signal, wherein j is an integer from 4 through 6. A metal line is connected between the data buffers DQ[2j+1] and DQ[2j+3], so as to transfer the batch of the data stored in the data buffer DQ[2j+3] to be stored in the data buffer DQ[2j+1] when the data buffers DQ[2j+1] and DQ[2j+3] are triggered by the clock signal.

Both referring to FIG. 1A and FIG. 2A, when the dual data outputting method is applied in the memory circuit, the first control input/output pin WP#/SIO2 and the second control input/output pin HOLD#/SIO3 respectively connected to the data buffers DQ[2] and DQ[3] are forbidden. Before the falling edge of the $27^{th}$ clock of the clock signal SCLK occurs, the data buffers DQ[0]~DQ[7] respectively store the 8 batches of the data D6, D7, D4, D5, D2, D3, D0, D1. When the falling edge of the $27^{th}$ clock of the clock signal SCLK triggers the data buffers DQ[0]~DQ[7], the 2 batches of the data D6, D7 stored in the data buffers DQ[0], DQ[1] are output respectively via the first input/output pin SI/SIO0 and the second input/output pin SO/SIO1, and the data buffers DQ[0]~DQ[7] respectively store the 8 batches of the data D4, D5, D2, D3, D0, D1, D6, D7. According to the same manner, the batches of the data stored in the data buffers DQ[0]~DQ[7] at the falling edges of the $28^{th}$ through $33^{rd}$ clocks of the clock signal SCLK can be known.

Referring to FIG. 2B, FIG. 2B is a schematic diagram showing a layout of the memory circuit using the quadruple data outputting method. The memory circuit has 16 data buffers DQ[0]~DQ[15], and a first input/output pin, a second input/output pin, a first control input/output pin, and a second control input/output pin are respectively connected to data buffers DQ[0]~DQ[3], so as to output the 4 batches of the data stored in the data buffers DQ[0]~DQ[3].

A metal line is connected between the data buffers DQ[4k] and DQ[4k+4], so as to transfer the batch of the data stored in the data buffer DQ[4k+4] to be stored in the data buffer DQ[4k] when the data buffers DQ[4k] and DQ[4k+4] are triggered by the clock signal, wherein k is an integer from 0 through 2. A metal line is connected between the data buffers DQ[4k+1] and DQ[4k+5], so as to transfer the batch of the data stored in the data buffer DQ[4k+5] to be stored in the data buffer DQ[4k+1] when the data buffers DQ[4k+1] and DQ[4k+5] are triggered by the clock signal. A metal line is connected between the data buffers DQ[4k+2] and DQ[4k+6], so as to transfer the batch of the data stored in the data buffer DQ[4k+6] to be stored in the data buffer DQ[4k+2] when the data buffers DQ[4k+2] and DQ[4k+6] are triggered by the clock signal. A metal line is connected between the data buffers DQ[4k+3] and DQ[4k+7], so as to transfer the batch of the data stored in the data buffer DQ[4k+7] to be stored in the data buffer DQ[4k+3] when the data buffers DQ[4k+3] and DQ[4k+7] are triggered by the clock signal.

Both referring to FIG. 1B and FIG. 2B, before the falling edge of the $27^{th}$ clock of the clock signal SCLK occurs, the data buffers DQ[0]~DQ[15] respectively store the 16 batches of the data D4~D7, D0~D3, D4~D7, D0~D3. When the falling edge of the $21^{st}$ clock of the clock signal SCLK triggers the data buffers DQ[0]~DQ[15], the 4 batches of the data D4~D7 stored in the data buffers DQ[0]~DQ[3] are output via the first input/output pin SI/SIO0, the second input/output pin SO/SIO1, the first control input/output pin WP#/SIO2, and the second control input/output pin HOLD#/SIO3, and the data buffers DQ[0]~DQ[15] respectively store the 16 batches of the data D0~D7 and D0~D7. According to the same manner, the batches of the data stored in the data buffers DQ[0]~DQ[15] at the falling edges of the $22^{nd}$ through $37^{th}$ clocks of the clock signal SCLK can be known.

Another dual data outputting method applied in a memory circuit, such as the serial flash memory, is illustrated in the U.S. Publication 20060067123. A serial flash memory is provided with multiple configurable pins, at least one of which is selectively configurable for use in either single-bit serial data transfers or multiple-bit serial data transfers. In single-bit serial mode, data transfer is bit-by-bit through a pin. In multiple-bit serial mode, a number of sequential bits are transferred at a time through respective pins. The serial flash memory may have 16 or fewer pins, and even 8 or fewer pins, so that low pin count packaging such as the 8-pin or 16-pin small-outline integrated circuit (SOIC) package and the 8-contact micro leadframe package (MLP), quad flat no leads (QFN) package, or small and thin-type package without lead (SON package) may be used. The availability of the single-bit serial type protocol enables compatibility with a number of existing systems, while the availability of the multiple-bit serial type protocol enables the serial flash memory to provide data transfer rates, in systems that can support them, that are significantly faster than available with standard serial flash memories.

To sum up, the conventional memory circuit uses its data buffers DQ[0]~DQ[3] as the output data buffers. Regarding the dual data outputting method, the batch of the data stored in the data buffer DQ[2n+2] is transferred to be stored in the data buffer DQ[2n], and the batch of the data stored in the data buffer DQ[2n+3] is transferred to be stored in the data buffer DQ[2n+1]. Regarding the quadruple data outputting method, the batch of the data stored in the data buffer DQ[n+4] is transferred to be stored in the data buffer DQ[n]. The metal lines responsible for data transferring corresponding to the dual data outputting method are not the same as those corresponding to the quadruple data outputting method. Therefore, the conventional memory circuit needs another 12-metal-line and multiplexer logic control for implementing both of the dual data outputting method and the quadruple data outputting method.

SUMMARY

An exemplary embodiment of the present disclosure provides a data outputting method of a memory circuit. The memory circuit having at least 16 data buffers DQ[0]—DQ[15] for storing at least 16 batches of data is provided. One of a dual data outputting mode and a quadruple data outputting mode is selected. If the quadruple data outputting mode is selected, when a clock signal triggers the 16 data buffers DQ[0]~DQ[15], the 4 batches of the data stored in the 4 data buffers DQ[0], DQ[1], DQ[8], DQ[9] are output via 4 input/output pins connected to the 4 data buffers DQ[0], DQ[1], DQ[8], DQ[9]. If the quadruple data outputting mode is selected, when a clock signal triggers the 16 data buffers DQ[0]~DQ[15], the batch of the data stored in the data buffer DQ[2n+2] is transferred to be stored in the data buffer DQ[2n], and the batch of the data stored in the data buffer DQ[2n+3] is transferred to be stored in the data buffer DQ[2n+1], for n is an integer from 0 through 2, and from 4 through 6.

An exemplary embodiment of the present disclosure provides a memory circuit. The memory circuit comprises 4 input/output pins, a zeroth through eleventh metal lines, and at least 16 data buffers DQ[0]~DQ[15] for storing 16 batches of data. The four input/output pins are connected to the 4 data buffers DQ[0], DQ[1], DQ[8], DQ[9]. The $2k^{th}$ metal line is connected to the 2 data buffers DQ[2k+2], DQ[2k], and the $(2k+1)^{th}$ metal line is connected to the 2 data buffers DQ[2k+3], DQ[2k+1], for k is an integer from 0 through 2. The $(2j-2)^{th}$ metal line is connected to the 2 data buffers DQ[2j+2], DQ[2j], and the $(2j-1)^{th}$ metal line is connected to the 2 data buffers DQ[2j+3], DQ[2j+1], for j is an integer from 4 through 6. When a quadruple data outputting mode is selected for the memory circuit, and the data buffers DQ[0]~DQ[15] are triggered, the 4 batches of the data stored in the data buffers DQ[0], DQ[1], DQ[8], DQ[9] are output via the 4 input/output pins, the batch of the data stored in the data buffer DQ[2n+2] is transferred to be stored in the data buffer DQ[2n], and the batch of the data stored in the data buffer DQ[2n+3] is transferred to be stored in the data buffer DQ[2n+1], for n is an integer from 0 through 2, and from 4 through 6.

An exemplary embodiment of the present disclosure provides a layout of a memory circuit. The layout of the memory circuit comprises 4 input/output pins, a zeroth through eleventh metal lines, and at least 16 data buffers DQ[0]~DQ[15]. The four input/output pins are connected to the 4 data buffers DQ[0], DQ[1], DQ[8], DQ[9]. The $2k^{th}$ metal line is connected to the 2 data buffers DQ[2k+2], DQ[2k], and the $(2k+1)^{th}$ metal line is connected to the 2 data buffers DQ[2k+3], DQ[2k+1], for k is an integer from 0 through 2. The $(2j-2)^{th}$ metal line is connected to the 2 data buffers DQ[2j+2], DQ[2j], and the $(2j-1)^{th}$ metal line is connected to the 2 data buffers DQ[2j+3], DQ[2j+1], for j is an integer from 4 through 6.

Accordingly, an exemplary embodiment of the present disclosure provides a memory circuit which can be operated in the quadruple and dual data outputting modes, without having another 12-metal-line and multiplexer logic control. Therefore, manufacture cost, layout area, and design complexity of the memory circuit can be reduced.

It is to be understood that both the foregoing general description and the following detailed description are exemplary, and are intended to provide further explanation of the disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the disclosure and, together with the description, serve to explain the principles of the disclosure.

FIG. 2A is a schematic diagram showing a layout of the memory circuit using the dual data outputting method.

FIG. 2B is a schematic diagram showing a layout of the memory circuit using the quadruple data outputting method.

DESCRIPTION OF THE EMBODIMENTS

Figure 1A:
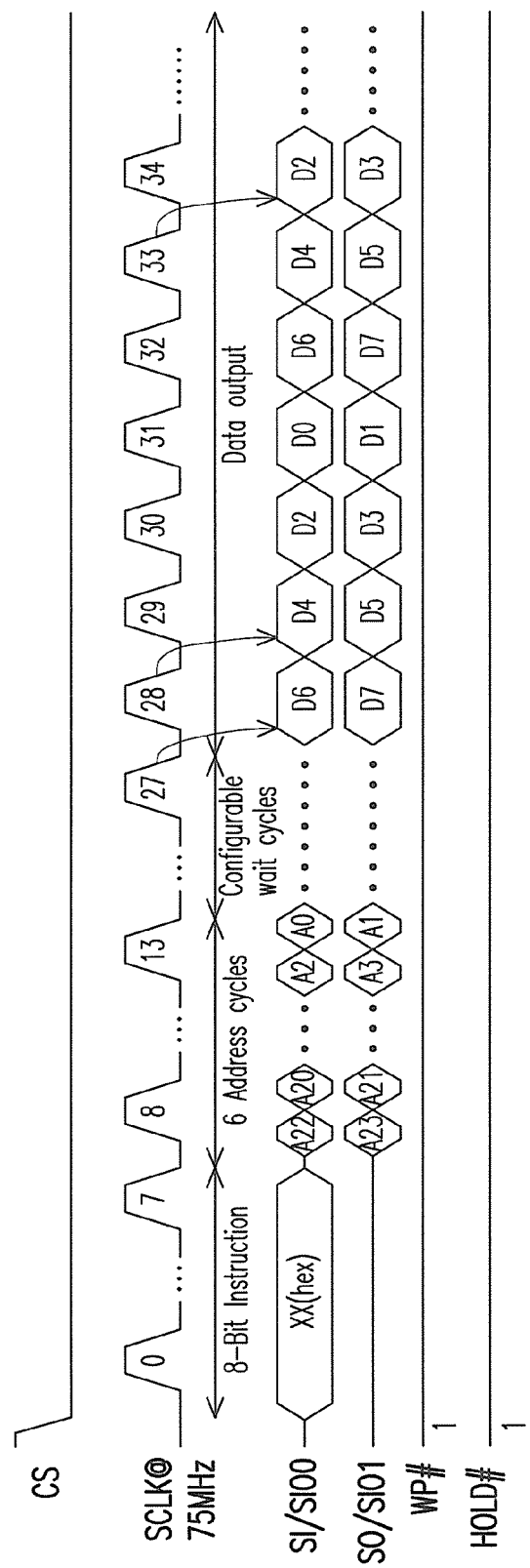
FIG. 1A is a wave diagram showing outputs of a serial peripheral interface memory circuit.
Figure 1B:
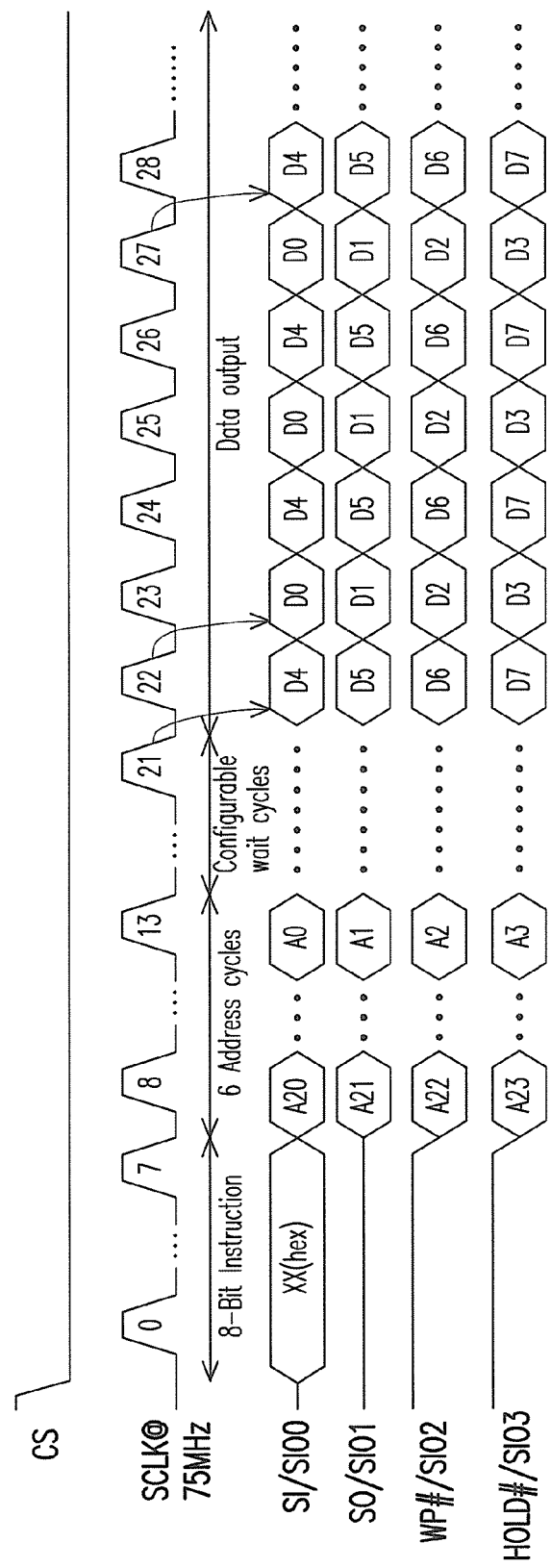
FIG. 1B is a wave diagram showing outputs of a serial peripheral interface memory circuit.

Reference will now be made in detail to the present preferred embodiment of the present disclosure, examples of which are illustrated in the accompanying drawings. Wherever possible, the same reference numbers are used in the drawings and the description to refer to the same or like parts.

To let the metal lines responsible for data transferring corresponding to the dual data outputting method be the same as those corresponding to the quadruple data outputting method, an exemplary embodiment of the present disclosure disclose a data outputting method of a memory circuit, the memory circuit, and the layout of the memory circuit.

Figure 3:
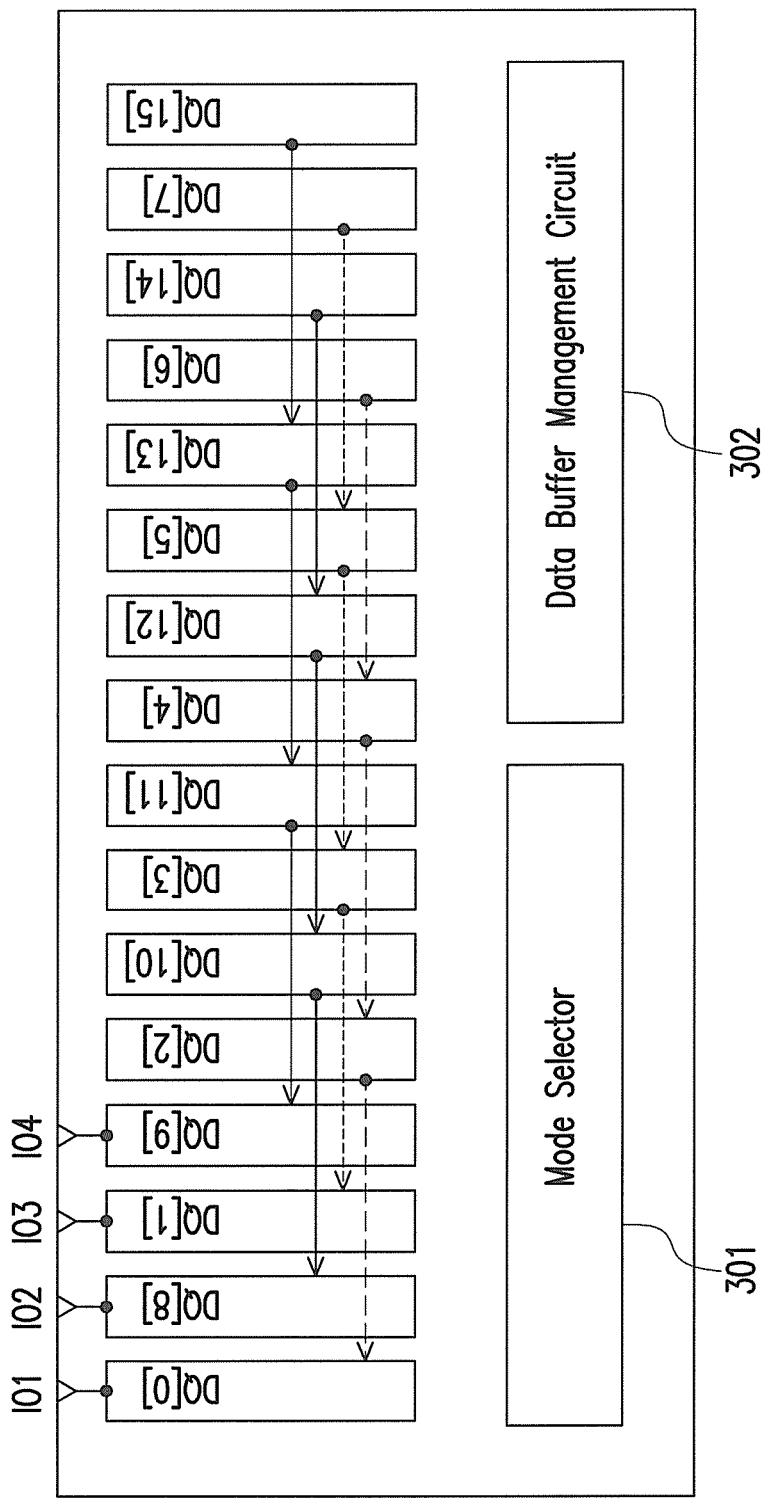
FIG. 3 is a schematic diagram showing a layout of the memory circuit using a data outputting method according to an exemplary embodiment of the present disclosure.

Referring to FIG. 3, FIG. 3 is a schematic diagram showing a layout of the memory circuit using a data outputting method according to an exemplary embodiment of the present disclosure. The data outputting method can be the dual data outputting method or the quadruple data outputting method. The metal lines responsible for data transferring corresponding to the dual data outputting method are the same as those corresponding to the quadruple data outputting method. The memory circuit 300 can be a serial flash memory. The memory circuit 300 comprises 4 input/output pins IO1~IO4, a zeroth through eleventh metal lines ML_0~ML_11, at least 16 data buffers DQ[0]~DQ[15], a mode selector 301, and a data buffer management circuit 302.

The 16 data buffers DQ[0]~DQ[15] stores 16 batches of data. The four input/output pins IO1~IO4 are connected to the 4 data buffers DQ[0], DQ[1], DQ[8], DQ[9], the $2k^{th}$ metal line ML_2k is connected to the 2 data buffers DQ[2k+2], DQ[2k], the $(2k+1)^{th}$ metal line ML_2k+1 is connected to the 2 data buffers DQ[2k+3], DQ[2k+1], for k is an integer from 0 through 2. For example, k is zero, the zeroth metal line ML_0 is connected to the data buffers DQ[0] and DQ[2], and the first metal line ML_1 is connected to the data buffers DQ[1] and DQ[3]. The $(2j-2)^{th}$ metal line ML_2j-2 is connected to the 2 data buffers DQ[2j+2], DQ[2j], the $(2j-1)^{th}$ metal line ML_2j-1 is connected to the 2 data buffers DQ[2j+3], DQ[2j+1], for j is an integer from 4 through 6. For example, j is 6, the tenth metal line ML_10 is connected to the data buffers DQ[14] and DQ[12], and the eleventh metal line ML_11 is connected to the data buffers DQ[15] and DQ[13].

The mode selector 301 selects one of the quadruple data outputting mode and a dual data outputting mode for the memory circuit 300 according to the user's demand. The data buffer management circuit 302 can forbid the 8 data buffers DQ[0]~DQ[7] or the 8 data buffers DQ[8]~DQ[15] when the dual data outputting mode is selected for the memory circuit 300, such that only the first and second input/output pins 101, 102 can output the 2 batches of the data stored in the data buffers DQ[0] and DQ[1] when the data buffers DQ[0] and DQ[1] are triggered by a clock signal, or only the third and fourth input/output pins IO3, IO4 can output the 2 batches of the data stored in the data buffers DQ[8] and DQ[9] when the data buffers DQ[8] and DQ[9] are triggered by a clock signal received thereby. It is noted that each of the data buffers DQ[0]~DQ[15] is triggered by a falling edge or a rising edge of the clock signal received thereby.

When a quadruple data outputting mode is selected for the memory circuit 300, and the data buffers DQ[0]~DQ[15] are triggered, the 4 batches of the data stored in the data buffers DQ[0], DQ[1], DQ[8], DQ[9] are output via the 4 input/output pins IO1~IO4, the batch of the data stored in the data buffer DQ[2n+2] is transferred to be stored in the data buffer DQ[2n], and the batch of the data stored in the data buffer DQ[2n+3] is transferred to be stored in the data buffer DQ[2n+1], for n is an integer from 0 through 2, and from 4 through 6. For example, n is 1, the batch of the data stored in the data buffer DQ[4] is transferred to be stored in the data buffer DQ[2], and the batch of the data stored in the data buffer DQ[5] is transferred to be stored in the data buffer DQ[3].

When the dual data outputting mode is selected for the memory circuit 300, the data buffer management circuit 302 forbids the 8 data buffers DQ[8]~DQ[15]. When the 8 data buffers DQ[0]~DQ[7] are triggered, the 2 batches of the data stored in the 2 data buffers DQ[0], DQ[1] are output via the 2 input/output pins 101, 102 connected to the data buffers DQ[0], DQ[1], the batch of the data stored in the data buffer DQ[2k+2] to be stored in the data buffer DQ[2k], and the batch of the data stored in the data buffer DQ[2k+3] is transferred to be stored in the data buffer DQ[2k+1]. For example, k is 1, the batch of the data stored in the data buffer DQ[4] is transferred to be stored in the data buffer DQ[2], and the batch of the data stored in the data buffer DQ[5] is transferred to be stored in the data buffer DQ[3].

The above exemplary embodiment for implementing the dual data outputting mode is not used to limit the present disclosure, and another exemplary embodiment for implementing the dual data outputting mode is described as follows.

When the dual data outputting mode is selected for the memory circuit 300, the data buffer management circuit 302 forbids the 8 data buffers DQ[0]~DQ[7]; when the 8 data buffers DQ[8]~DQ[15] are triggered, the 2 batches of the data stored in the 2 data buffers DQ[8], DQ[9] are output via the 2 input/output pins IO3, IO4 connected to the data buffers DQ[8], DQ[9], the batch of the data stored in the data buffer DQ[2j+2] to be stored in the data buffer DQ[2j], and the batch of the data stored in the data buffer DQ[2j+3] is transferred to be stored in the data buffer DQ[2j+1]. For example, j is 5, the batch of the data stored in the data buffer DQ[12] is transferred to be stored in the data buffer DQ[10], and the batch of the data stored in the data buffer DQ[13] is transferred to be stored in the data buffer DQ[11].

Figure 4A:
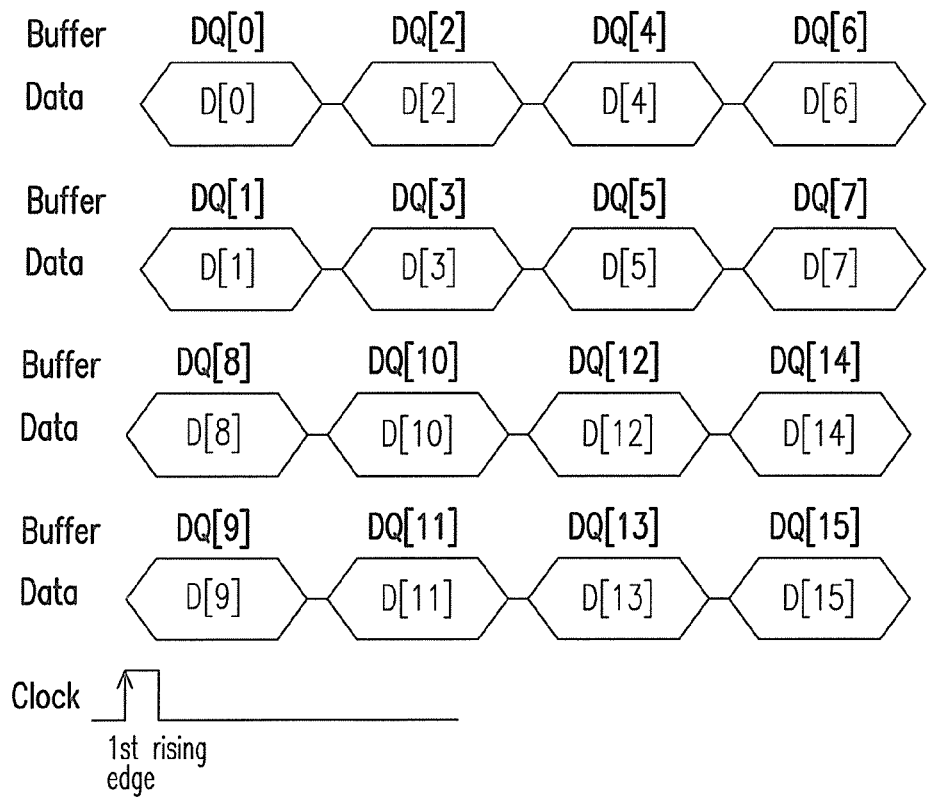
FIG. 4A is a wave diagram showing the 16 batches of the data stored in the data buffers DQ[0]-DQ[15] while a first rising edge of the clock signal triggers the data buffers DQ[0]~DQ[15].
Figure 4B:
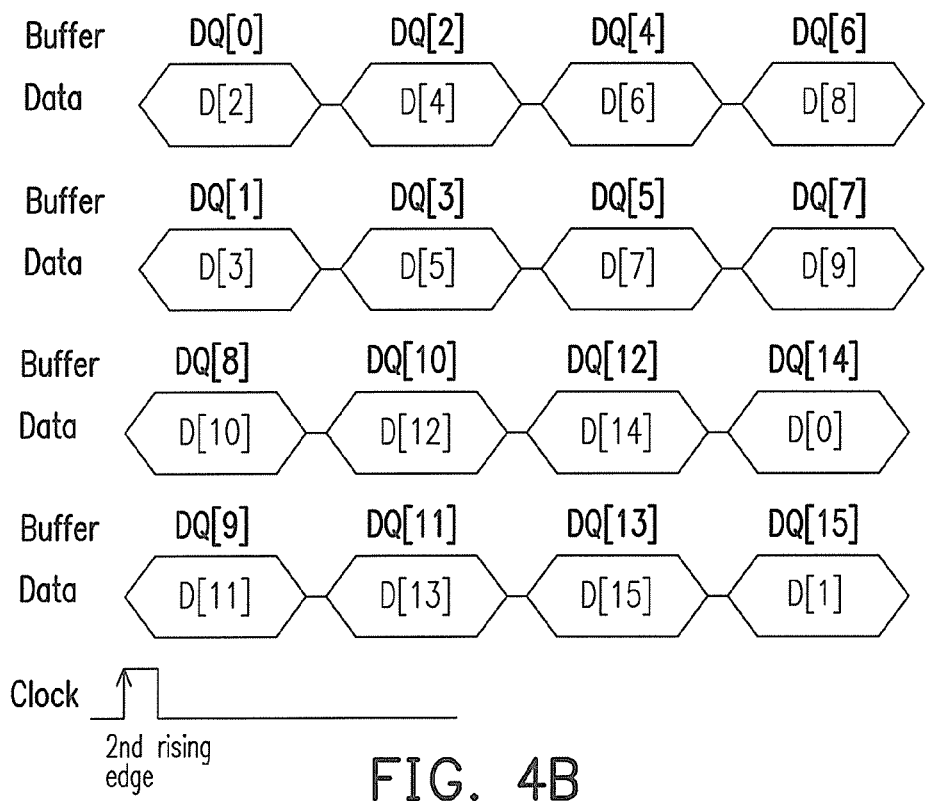
FIG. 4B is a wave diagram showing the 16 batches of the data stored in the data buffers DQ[0]~DQ[15] while a second rising edge of the clock signal triggers the data buffers DQ[0]~DQ[15].

Referring to FIG. 3, FIG. 4A and FIG. 4B, FIG. 4A is a wave diagram showing the 16 batches of the data stored in the data buffers DQ[0]~DQ[15] while a first rising edge of the clock signal triggers the data buffers DQ[0]~DQ[15], and FIG. 4B is a wave diagram showing the 16 batches of the data stored in the data buffers DQ[0]~DQ[15] while a second rising edge of the clock signal triggers the data buffers DQ[0]~DQ[15].

The quadruple data outputting mode is selected for the memory circuit 300, and only the rising edge of the clock signal is used to trigger the data buffers DQ[0]~DQ[15] in the exemplary embodiment. However, it is noted that in the other exemplary embodiment, the falling edge of the clock signal may be used to trigger the data buffers DQ[0]~DQ[15]. In FIG. 4A, while the first rising edge of the clock signal triggers the data buffers DQ[0]~DQ[15], the data buffers DQ[0]~DQ[15] respectively stores the 16 batches of the data D[0]~D[15]. Then in FIG. 4B, while the second rising edge of the clock signal triggers the data buffers DQ[0]~DQ[15], the 4 batches of the data D[0], D[1], D[8], D[9] which are stored in the data buffers DQ[0], DQ[1], DQ[8], DQ[9] before the second rising edge of the clock signal occurs are output via the first through fourth input/output pins IO1~IO4. At the meanwhile, the data buffers DQ[0]~DQ[15] respectively stores the 16 batches of the data D[2]~D[15], D[0], D[1].

Figure 5:
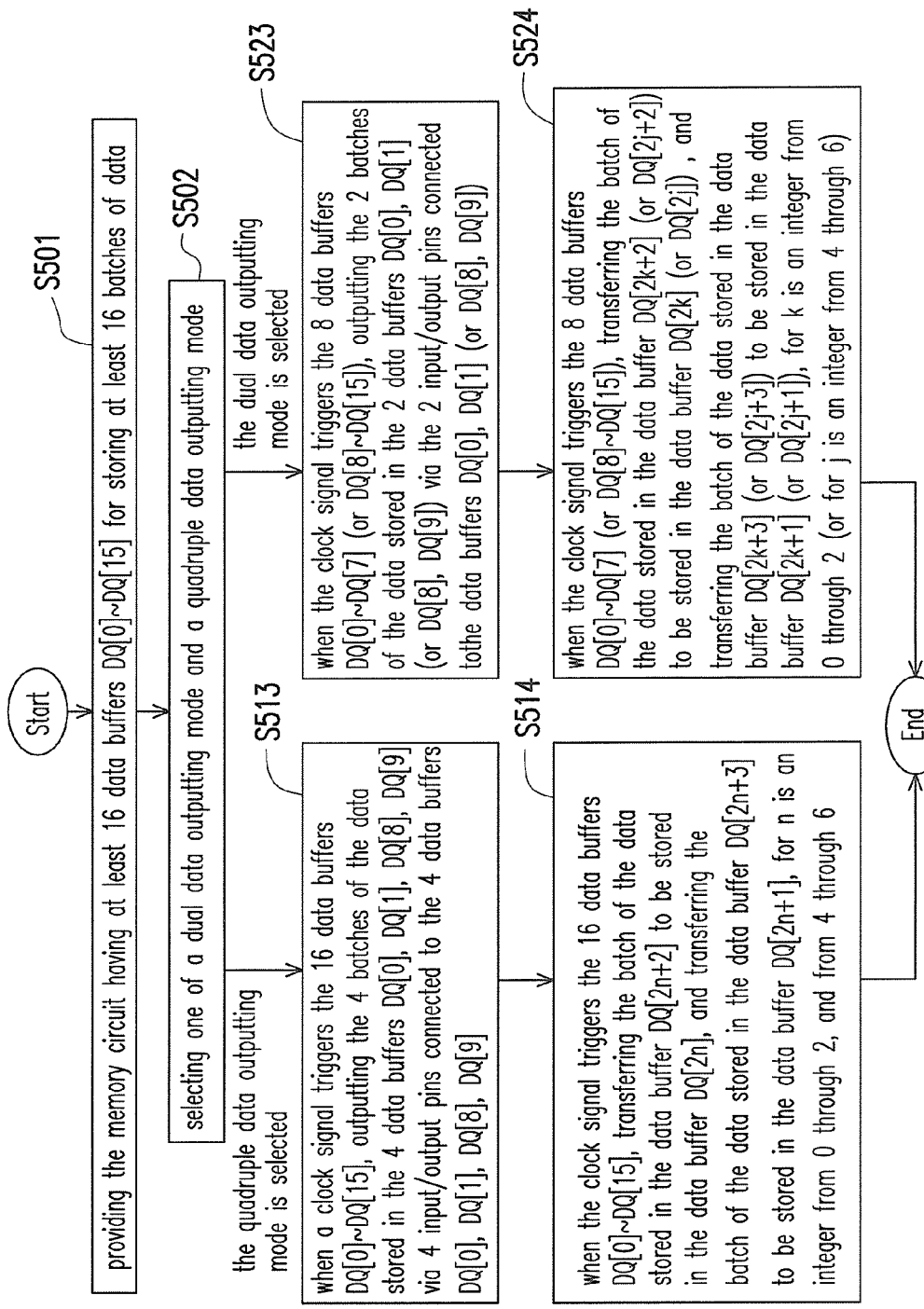
FIG. 5 is a flow chart showing a data outputting method of a memory circuit provided by an exemplary embodiment of the present disclosure.

Referring to FIG. 5, FIG. 5 is a flow chart showing a data outputting method of a memory circuit provided by an exemplary embodiment of the present disclosure. At step S501, the memory circuit having at least 16 data buffers DQ[0]~DQ[15] for storing at least 16 batches of data is provided. The memory circuit can be the memory circuit 300 described in the above exemplary embodiment of FIG. 3. At step S502, one of a dual data outputting mode and a quadruple data outputting mode is selected. If the quadruple data outputting mode is selected, step S513 will be executed; if the dual data outputting mode is selected, step S523 will be executed.

At step S513, when a clock signal triggers the 16 data buffers DQ[0]~DQ[15], the 4 batches of the data stored in the 4 data buffers DQ[0], DQ[1], DQ[8], DQ[9] are output via 4 input/output pins connected to the 4 data buffers DQ[0], DQ[1], DQ[8], DQ[9]. Then at step S514, when the clock signal triggers the 16 data buffers DQ[0]~DQ[15], the batch of the data stored in the data buffer DQ[2n+2] is transferred to be stored in the data buffer DQ[2n], and the batch of the data stored in the data buffer DQ[2n+3] is transferred to be stored in the data buffer DQ[2n+1], for n is an integer from 0 through 2, and from 4 through 6.

At step S523, when the clock signal triggers the 8 data buffers DQ[0]~DQ[7] (or DQ[8]~DQ[15]), the 2 batches of the data stored in the 2 data buffers DQ[0], DQ[1] (or DQ[8], DQ[9]) are output via the 2 input/output pins connected to the data buffers DQ[0], DQ[1] (or DQ[8], DQ[9]). At step S524, when the clock signal triggers the 8 data buffers DQ[0]~DQ[7] (or DQ[8]~DQ[15]), the batch of the data stored in the data buffer DQ[2k+2] (or DQ[2j+2]) is transferred to be stored in the data buffer DQ[2k] (or DQ[2j]), and the batch of the data stored in the data buffer DQ[2k+3] (or DQ[2j+3]) is transferred to be stored in the data buffer DQ[2k+1] (or DQ[2j+1]), for k is an integer from 0 through 2 (or for j is an integer from 4 through 6).

To sum up, an exemplary embodiment of the present disclosure provides a memory circuit which can be operated in the quadruple and dual data outputting modes, without having another 12-metal-line and multiplexer logic control. Therefore, manufacture cost, layout area, and design complexity of the memory circuit can be reduced.

It will be apparent to those skilled in the art that various modifications and variations can be made to the structure of the present disclosure without departing from the scope or spirit of the disclosure. In view of the foregoing descriptions, it is intended that the present disclosure covers modifications and variations of this disclosure if they fall within the scope of the following claims and their equivalents.

What is claimed is:
1. A data outputting method of a memory circuit, comprising:
providing the memory circuit having at least 16 data buffers DQ[0]~DQ[15] for storing at least 16 batches of data, wherein the data buffers are arranged in an order that is DQ[0], DQ[8], DQ[1], DQ[9], DQ[2], DQ[10], DQ[3], DQ[11], DQ[4], DQ[12], DQ[5], DQ[13], DQ[6], DQ[14], DQ[7] and DQ[15], a zeroth through eleventh metal lines are used to connect the data buffers, the $2k^{th}$ metal line is connected to the 2 data buffers DQ[2k +2], DQ[2k], the $(2k+1)^{th}$ metal line is connected to the 2 data buffers DQ[2k +3], DQ[2k +1], for k is an integer from 0 through 2, and the $(2j-2)^{th}$ metal line is connected to the 2 data buffers DQ[2j +2], DQ[2j], the $(2j-1)^{th}$ metal line is connected to the 2 data buffers DQ[2j +3], DQ[2j +1], for j is an integer from 4 through 6;
selecting one of a dual data outputting mode and a quadruple data outputting mode by a mode selector;
if the quadruple data outputting mode is selected:
when a clock signal triggers the 16 data buffers DQ[0]~DQ[15], outputting the 4 batches of the data stored in the 4 data buffers DQ[0], DQ[1], DQ[8], DQ[9], via 4 input/output pins connected to the 4 data buffers DQ[0], DQ[1], DQ[8], DQ[9]; and when the clock signal triggers the 16 data buffers DQ[0]~DQ[15], transferring the batch of the data stored in the data buffer DQ[2n +2] to be stored in the data buffer DQ[2n], and transferring the batch of the data stored in the data buffer DQ[2n +3] to be stored in the data buffer DQ[2n +1], for n is an integer from 0 through 2, and from 4 through 6.

2. The data outputting method according to claim 1, wherein if the dual data outputting mode is selected:

when the clock signal triggers the 8 data buffers DQ[0]~DQ[7], outputting the 2 batches of the data stored in the 2 data buffers DQ[0], DQ[1], via the 2 input/output pins connected to the data buffers DQ[0], DQ[1]; and when the clock signal triggers the 8 data buffers DQ[0]~DQ[7], transferring the batch of the data stored in the data buffer DQ[2k +2] to be stored in the data buffer DQ[2k], and transferring the batch of the data stored in the data buffer DQ[2k +3] to be stored in the data buffer DQ[2k +1], for k is an integer from 0 through 2.

3. The data outputting method according to claim 1, wherein if the dual data outputting mode is selected:

when the clock signal triggers the 8 data buffers DQ[8]~DQ[15], outputting the 2 batches of the data stored in the data buffers DQ[8], DQ[9] via the 2 input/output pins connected to the data buffers DQ[8], DQ[9]; and when the clock signal triggers the 8 data buffers DQ[8]~DQ[15], transferring the batch of the data stored in the data buffer DQ[2j +2] to be stored in the data buffer DQ[2j], and transferring the batch of the data stored in the 2 data buffer DQ[2j +3] to be stored in the data buffer DQ[2j +1], for j is an integer from 4 through 6.

4. The data outputting method according to claim 1, wherein the memory circuit is a serial flash memory.

5. The data outputting method according to claim 1, wherein a falling edge or a rising edge of a clock signal is used to trigger at least one of the data buffers DQ[0]~DQ[15].

* * * * *